United States Patent
Fonash et al.

(10) Patent No.: US 6,627,842 B1
(45) Date of Patent: Sep. 30, 2003

(54) MICRO-PROTRUSION ARRAYS FABRICATED BY E-BEAM EXPOSURE

(75) Inventors: Stephen J. Fonash, State College, PA (US); A. Kaan Kalkan, Eregli (TR)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 09/374,905

(22) Filed: Aug. 13, 1999

Related U.S. Application Data

(60) Provisional application No. 60/096,501, filed on Aug. 14, 1998.

(51) Int. Cl.[7] .............................................. B23K 15/00
(52) U.S. Cl. ......................... 219/121.17; 219/121.16; 219/121.25
(58) Field of Search ...................... 219/121.17, 121.16, 219/121.25, 121.15; 428/444, 445; 437/225

(56) References Cited

U.S. PATENT DOCUMENTS

| | | | | |
|---|---|---|---|---|
| 4,817,124 A | * | 3/1989 | Ketterson et al. | 378/119 |
| 5,392,272 A | * | 2/1995 | Parkinson | 369/100 |
| 5,856,967 A | * | 1/1999 | Mamin et al. | 369/126 |
| 6,048,255 A | * | 4/2000 | Kuo et al. | 451/41 |

OTHER PUBLICATIONS

J. Appl. Phy 82(2) pp. 639–643; Muruno et al., Jul. 1997.*
Applied Physics Letters, vol. 74, No. 11, Mar. 15, 1999, pp. 1621–1623, Nan Li et al., "Nanofabrication on Si Oxide with Scanning Tunneling Microscope: Mechanism of the Low–Energy Electron–Stimulated Reaction".
1994 IEEE, Dec. 5–9, 1994, pp. 1387–1390, M. Pauli et al. "A New Fabrication Method for Multicrystalline Silicon Layers on Substrates Suited for Low–Cost Thin Film Solar Cells".
Journal Applied Physics 78 (2), Jul. 15, 1995, pp. 974–981, I. Jenčič et al., "Electron–Beam–Induced Crystallization of Isolated Amorphous Regions in Si, Ge, GaP, and GaAs".
Journal Applied Physics 82 (2), Jul. 15, 1997, pp. 639–643, S. Maruno et al., "Observation of Selective Thermal Desorption of Electron Stimulated $SIO_2$ with a Combined Scanning Reflection Electron Microscope/Scanning Tunneling Microscope".
Physical Review B, vol. 36, No. 15, Nov. 15, 1987, pp. 8038–8042, G. Lulli et al., "Solid–Phase Epitaxy of Amorphous Silicon Induced by Electron Irradiation at Room Temperature".

* cited by examiner

*Primary Examiner*—M. Alexandra Elve
(74) *Attorney, Agent, or Firm*—Ohlandt, Greeley, Ruggiero and Perle LLP

(57) ABSTRACT

The method of the invention produces protruding features on a glass layer. Initially, a conductive layer is applied to the glass layer and is coupled to a source of reference potential. This conductive layer prevents a build-up of electrons in the glass layer when it is exposed to an electron beam. Thereafter, an electron beam is directed at combined layers in areas where protruding features are to be produced. The energy, current density and duration of application of the electron beam are controlled so as to create a melt/softened region within the glass layer. Such softening and differences in expansion rates between the softened glass and the surrounding glass causes a protruding feature to appear on the surface of the glass layer.

5 Claims, 4 Drawing Sheets

MICRO-PROTRUSION ARRAYS FABRICATED BY E-BEAM EXPOSURE

This Application claims priority from Provisional Application, Serial No. 60/096,501, filed Aug. 14, 1998.

FIELD OF THE INVENTION

This invention relates to fabrication of arrays of physically raised structures on glass substrates and, more particularly, to a method and apparatus for producing such a arrays of raised structures through use of electron-beam exposure apparatus.

BACKGROUND OF THE INVENTION

Micro-arrays of physically protruding structures from a planar surface have uses in a number of fields of application, including biology, optics, displays and printing. A variety of techniques have been utilized to fabricate such arrays, including lithography/etching and laser processing. For example, during the production of semiconductor devices, pedestal and other raised shapes have been produced through the use of a combination of lithography, followed by either wet or plasma etching, to leave the protruding structures.

Recently, fabrication of structures in silicon-oxide have been tried, using a low-energy electron-beam stimulated reactions. More specifically, by exposing a finely focused, high-energy electron beam onto a thin silicon oxide layer, followed by either wet etching or a thermal desorption procedure, nanometer-sized windows were formed in a silicon-oxide layer. Further, etching of a thin silicon oxide layer has been reported using a low energy electron beam stimulated reaction. Such reaction was accomplished using a scanning tunneling microscope and thermal desorption. This method of nano-fabrication enabled an array of pin holes and trenches to be produced in the thin silicon oxide layer. See Li et al., "Nano-Fabrication on Si Oxide With Scanning Tunneling Microscope: Mechanism of the Low-Energy Electron-Stimulated Reaction," Applied Physics Letters, Vol. 74, No. 11, Mar. 15, 1999, Pages 1621–1623.

Maruno et al. have also reported selective thermal desorption of a silicon dioxide film of less than one nanometer in thickness that was induced by a focused electron beam. Their findings indicated that clean, silicon opened windows were formed in the silicon dioxide film and that the surface morphology depended on electron dose, oxide film thickness and desorption temperature. See "Observation of Selective Thermal Desorption of Electron Stimulated $SiO_2$ With a Combined Scanning Reflection Electron Microscope/Scanning Tunneling Microscope" Journal of Applied Physics, Vol. 82, No. 2, Jul. 15, 1997, Pages 639–643.

Another e-beam patterning technique in the prior art is described by Wendel et al. in Applied Physics Letters, Vol. 67, page 3732 (1995) where contamination build-up is used to accomplish the patterning in a manner similar to plasma deposition. The deposition occurs as a result of polymerization of contaminating species, such as C, O and H.

Two of the above-indicated references describe a subtractive process for creating a physical feature in a silicon oxide layer. The third describes an additive process that utilizes contaminant particles. By contrast, there is a need for a non-subtractive method for creating protruding features from silicon oxide surfaces that retain the transparency and characteristics of the underlying substrate. Such features may be utilized to create finely pointed emission sources, barriers between adjacent pixel sites in flat panel displays, etc.

SUMMARY OF THE INVENTION

The method of the invention produces protruding features on a glass layer. Initially, a conductive layer is applied to the glass layer and is coupled to a source of reference potential. This conductive layer prevents a build-up of electrons in the glass layer when it is exposed to an electron beam. Thereafter, an electron beam is directed at combined layers in areas where protruding features are to be produced. The energy, current density and duration of application of the electron beam are controlled so as to create a melt/softened region within the glass layer. Such softening and differences in expansion rates between the softened glass and the surrounding glass causes a protruding feature to appear on the surface of the glass layer.

DETAILED DESCRIPTION OF THE INVENTION

Figure 1:
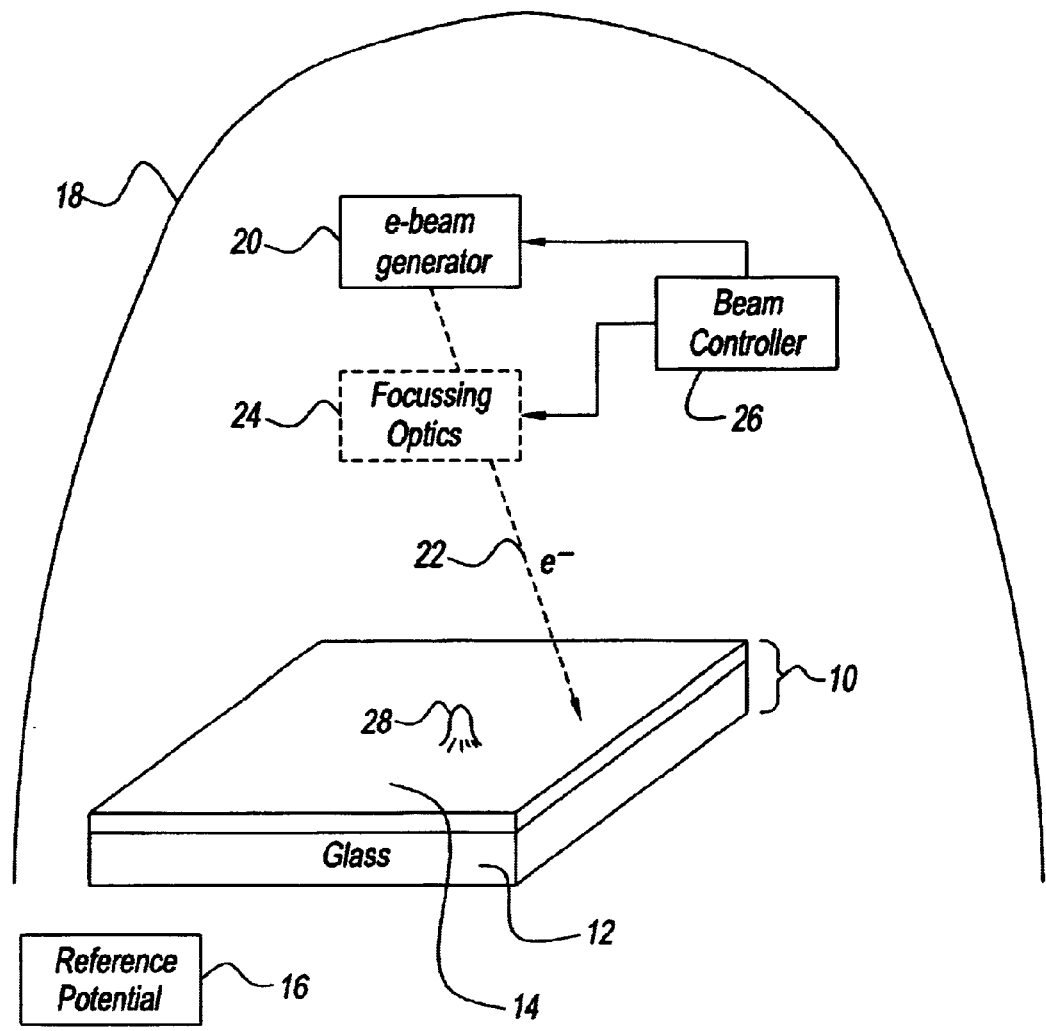
FIG. 1 is a schematic diagram of an electron beam system that implements the invention hereof.

Referring to FIG. 1, a substrate 10 is includes a glass plate 12 that is initially coated with a conductive layer 14. During subsequent processing, conductive layer 14 is connected to a source of reference potential 16. Note, that while reference potential 16 may be a ground connection, it may be another voltage and, further, may be used to control the height of the protrusions to be later produced on substrate 10.

Substrate 10 is placed in an e-beam apparatus 18 that includes an e-beam generator 20 which produces an e-beam 22 that may be moved across the surface of substrate 10 via control of focusing optics 24. A beam controller 26 comprises a processor that is programmed to control e-beam generator 20 and focusing optics 24 to cause e-beam 22 to traverse across the surface of substrate 10 in a manner so as to expose selected surface regions thereof.

Beam controller 26 causes e-beam 22 to apply a prescribed dose (in terms of $Coulombs/cm^2$) of electrons to substrate 10. The dose controls the quantity of electrons penetrating conductive coating 14 whose energy is to be absorbed (and dissipated as heat) within glass plate 12. The absorbed electrons cause a heating at the site of the absorption and a localized softening/liquefaction of the glass. As a result of differential rates of expansion between the softened glass region and the remaining areas of glass plate 12, an upward expansion of the softened region occurs and creates protrusion 26.

If beam controller 26 is operated to cause e-beam 22 to scan across the surface of substrate 10, a protruding ridge can be created. Accordingly, in accordance with the control of e-beam 22, substantially any pattern of protrusions can be created on the upper surface of substrate 10.

The placement of conductive layer 12 prevents a build-up of electrons on the upper surface of substrate 10 which, if present, will tend to cause the incident electrons to scatter. Such scattering will prevent the creation of well-defined protrusions 28.

With respect to glass plate 12, it has been determined that certain glasses are preferred for this application. In particular, borosilicate and alumina silicate glasses (e.g., Corning 7059 and 1737, respectively) have been tested and been found to operate satisfactorily with the invention. Importantly, the glass plate should be such as to absorb energy from the e-beam within the mass of the plate so that heating occurs internally to the plate.

Conductive layer 14 may be any conductive metal or a layer of amorphous silicon or other semiconductor. It must just be sufficiently conductive to prevent an accumulation of charge on conductive layer 14. Further, if an amorphous silicon layer is utilized, the application of e-beam 22, at given dose levels, will result in a localized crystallization in the exposed areas of the silicon, enabling further processing of the crystallized areas into device structures.

Figure 1A:
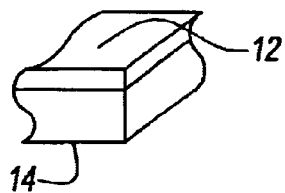
FIG. 1a illustrates an alternative placement of a conductive layer on the glass layer of FIG. 1, when the glass layer is sufficiently thin.

While the above description has assumed the presence of conductive layer 14 on the top surface of glass layer 12, if glass layer 12 is sufficiently thin, conductive layer 14 may be placed on its lower surface as shown in FIG. 1a. Under such a condition, the underlying conductive layer collects the impinging electrons after they lose energy and cause a heating of glass layer 12. Accordingly, an electron build-up is avoided. For example, a layer of 7059 glass may be sputtered or evaporated on aluminum foil and uniform protrusions thereafter produced by exposure of the glass layer to an e-beam Experimental The e-beam exposure apparatus employed was a Leica EBPG5-HR Electron Beam Lithography system. All e-beam exposures were carried out at an electron energy of 50 KeV, and with a beam spot-size of 0.5 um. The glass substrates used for the array writing included Corning 7059 and 1737. Some of these glass substrates were coated, prior to e-beam exposure, with 150 Å thick metal (Ni) or 1000 Å thick a-Si:H (hydrogenated amorphous Si) thin films.

Cracks in the a-Si:H films were observed upon e-beam exposure, possibly due to rapid hydrogen evolution. It has been found that this problem can be avoided by dehydrogenation of the Si films at 600° C. for 1 hour. Accordingly, all Si coated samples were dehydrogenated before the e-beam exposure to stop cracking. The relation between protrusion parameters and e-beam current density and dose was investigated for all three types of substrates Table 1 below shows the e-beam dose and current density dependence of protrusions produced on Si coated 7059 glass samples. It can be seen that protrusions occur only for defined current density and dose thresholds.

TABLE 1

Dose and current density dependence of protrusion formation and Si film crystallization on Si coated substrates.

| | | Current Density (A/cm$^2$) | |
| --- | --- | --- | --- |
| | | 225 | 509 |
| Dose (C/cm$^2$) | 1.0 | X | ✓✓ |
| | 0.5 | X | ✓✓ |

TABLE 1-continued

Dose and current density dependence of protrusion formation and Si film crystallization on Si coated substrates.

| | Current Density (A/cm$^2$) | |
| --- | --- | --- |
| | 225 | 509 |
| 0.2 | X | ✓ |
| 0.1 | X | X |

✓✓ Protrusion and crystallization both occurred
✓ Protrusion occurred only
X Protrusion and crystallization occurred According to a local-area-heating model to explain the protrusion formation, the heat generation rate depends on the current density and the energy of the e-beam electrons. On the other hand, for a given current density, the amount of dose determines the exposure time. Table 1 shows that the longest exposure required to form protruding-features is less than 2 milliseconds. Within this short duration, the e-beam exposed site is possibly far from reaching steady-state conditions and therefore is assumed to be undergoing a monotonic temperature rise. Accordingly, if the exposure time is not long enough to reach the softening or melting temperature of the glass, no protruding features will be obtained.

Other evidence to support the model that protrusion formation is a thermal effect is obtained from the a-Si coated substrates. These samples show that protrusion formation is accompanied by crystallization of the amorphous Si film. This crystallization occurs on the protrusions due to the heat generation in the underlying glass substrate. As seen from Table 1, similar to protrusion formation, the Si film crystallizes only for defined threshold current density and dose values.

Figure 2:
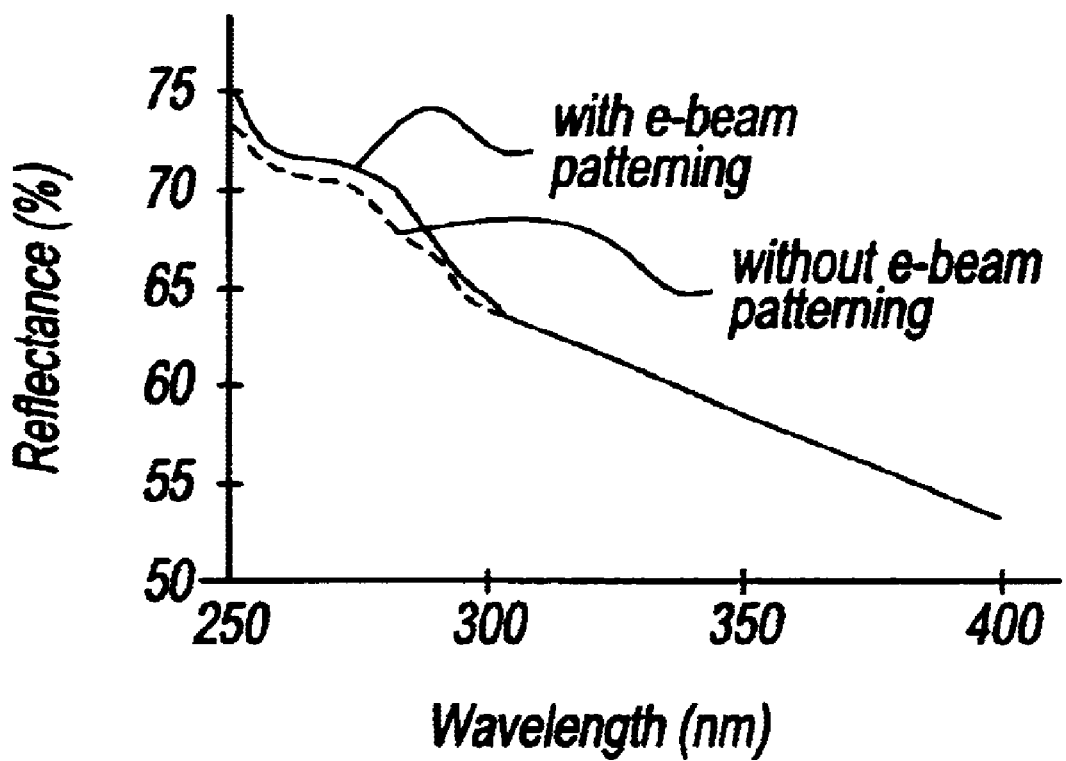
FIG. 2 is a plot of ultra-violet reflectance of unexposed and e-beam patterned samples, coated with silicon films.

The crystallization of the Si films on protrusions is demonstrated in FIG. 2 which shows the UV reflectance from the protrusion area compared to the UV reflectance from the precursor (not e-beam exposed) amorphous Si film. The slight reflectance peak at 276 nm identifies Si as crystalline at the protrusions. Here, even though the crystallized pattern constitutes less than $\frac{1}{50}^{th}$ of the sampled area, a slight feature at 276 nm is distinguishable. Furthermore, crystallization on the protrusions at the e-beam exposed spots is distinguishable from the surrounding amorphous regions by its distinct reflectance (i.e., color) with an optical microscope. Any additional heat generation in the Si film on these coated samples can be predicted to be negligible. In the range of the e-beam exposure parameters used during the experimental investigations, the steady-state temperature rise due to e-beam interaction in the Si film is calculated to be less than 10° C.

Figure 3A:
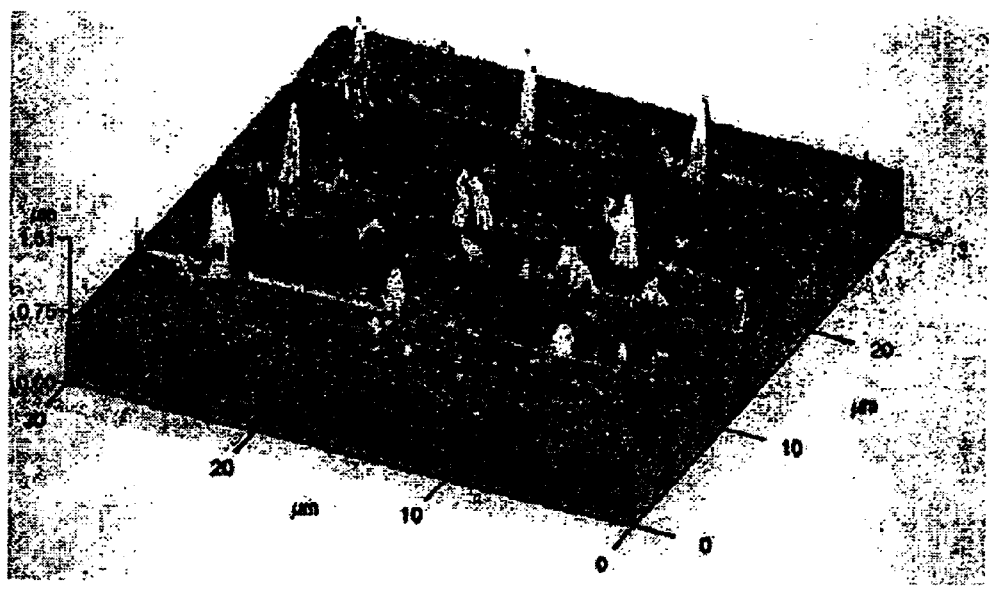
FIG. 3a illustrates a three-dimensional microphotograph of protrusion arrays obtained on bare 7059 glass.
Figure 3B:
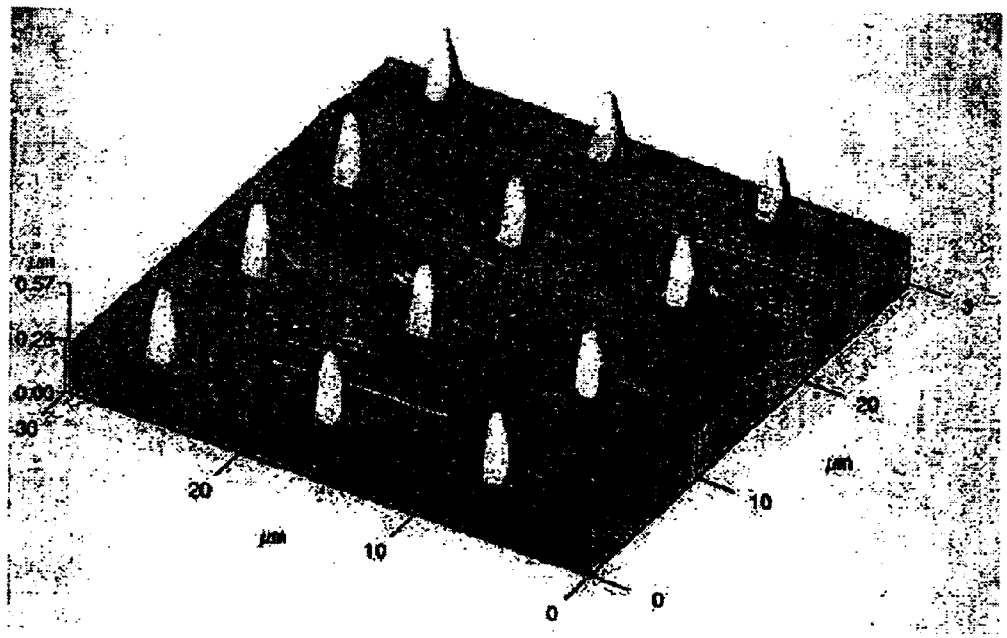
FIG. 3b illustrates a microphotograph of protrusion arrays obtained on silicon-coated 7059 glass.

In general, the properties of the glass plate plays an important role in the protrusion phenomenon. The 1737 substrates showed the protrusion response only for the highest dose and current density shown in Table 1 and with lower protrusion height compared to 7059 plates. This may arise from the different heat generation rates induced in the two glasses due to their distinct chemical compositions. However, it is more likely that this may be attributed to the higher softening or melting temperature of the 1737 glass compared to the 7059 glass FIGS. 3a and 3b show, using atomic force microscopy (AFM), the protrusion arrays obtained on bare and Si coated 7059 glass. Again the data shown for coated substrates are for Si thin film coatings. While protrusions are formed on both bare and coated substrates, the protrusions on the coated glass have better profiles. This is because, in the case when the e-beam impinges on bare insulating glass, the resulting accumulated charges hinder and distort the further impingement of electrons and thereby hinder and distort the heating that causes the protrusion phenomenon. In the case of Si coated glass, the sample has much better electrical conductance. Consequently, charge does not build up and the heating and resulting glass protrusions are much more uniform.

Figure 4:
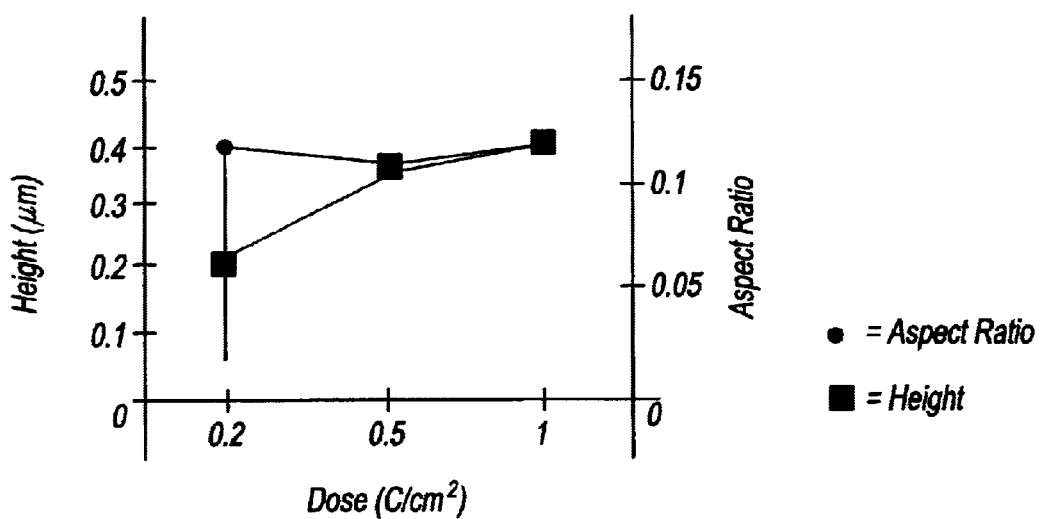
FIG. 4 is a plot of dose dependence versus protrusion height and aspect ratio for a silicon-coated 7059 glass.

FIG. 4 shows the dose dependence of the protrusion height and aspect ratio for the Si coated 7059 substrates. As seen in the data, the protrusion heights increase with increasing doses (therefore with increasing exposure time) while the aspect ratios remain nearly constant. It is anticipated that the aspect ratio is dependent on the physical properties of the glass (such as thermal conductivity, thermal expansion coefficient and viscoelasticity) as well as the applied electron energy. With lower electron energies, sharper protrusions are expected as this will move the heat generation closer to the surface of the glass.

In summary, a new technique has been developed that is able to selectively create arrays of protruding structures on the surface of glass plates. The creation of these protruding arrays requires no etching and uses only direct e-beam exposure. The protrusion parameters (height, aspect ratio and uniformity) are controllable in a specified range that is dependent upon the type of glass substrate and on substrate coating.

It should be understood that the foregoing description is only illustrative of the invention. Various alternatives and modifications can be devised by those skilled in the art without departing from the invention. For example, while a glass plate has been described above, the invention is also applicable to other glass forms, such as spun on and sputtered glass layers. Accordingly, the present invention is intended to embrace all such alternatives, modifications and variances which fall within the scope of the appended claims.

What is claimed is:

1. A method for producing a protruding feature on a glass layer, wherein said glass is borosilicate or alumina-silicate, said method comprising the steps of:

a) applying a conductive layer to said glass layer, said conductive layer connected to a source of reference potential;

b) directing an electron flux at said glass layer in an area where said protruding feature is to be produced; and c) controlling an energy, magnitude and duration of application of said electron flux, wherein said electron flux is applied to a dose level of at least about 0.2 coulombs per $cm^2$ to said glass layer, and wherein said glass layer exhibits a protruding feature.

2. The method as recited in claim 1, wherein said electron-beam flux is applied at least about 500 Amps per $cm^2$ to said glass layer.

3. The method as recited in claim 1, wherein said reference potential is variable so as to control impingement of said electron flux and a resulting height of said protruding feature.

4. A method for producing a protruding feature on a glass layer, wherein said glass is borosilicate or alumina-silicate, said method comprising the steps of:

a) directing an electron flux at said glass layer in an area where a protruding feature is to be produced;

b) controlling the energy and duration of application of said electron flux, wherein said electron flux is applied to a dose level of at least about 0.2 coulombs per $cm^2$ to said glass layer, and wherein said glass layer exhibits a protruding feature.

5. The method of claim 4, wherein said electron-beam flux is applied at least about 500 Amps per $cm^2$ to said glass layer.

* * * * *